(12) United States Patent
Takahashi et al.

(10) Patent No.: US 7,333,661 B2
(45) Date of Patent: Feb. 19, 2008

(54) IMAGE CODING DEVICE IMAGE CODING METHOD AND IMAGE PROCESSING DEVICE

(75) Inventors: Toshiyuki Takahashi, Tokyo (JP); Masayuki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 680 days.

(21) Appl. No.: 10/489,180

(22) PCT Filed: Jul. 14, 2003

(86) PCT No.: PCT/JP03/08901

§ 371 (c)(1), (2), (4) Date: Mar. 10, 2004

(87) PCT Pub. No.: WO2004/030343

PCT Pub. Date: Apr. 8, 2004

(65) Prior Publication Data

US 2004/0240742 A1 Dec. 2, 2004

(30) Foreign Application Priority Data

Sep. 27, 2002 (JP) ............................ 2002-282402

(51) Int. Cl.
*G06T 9/00* (2006.01)
(52) U.S. Cl. ...................... 382/239; 382/248; 382/251
(58) Field of Classification Search ........ 382/232–240, 382/248, 224, 251, 275; 348/438; 358/433, 358/539
See application file for complete search history.

(56) References Cited

U.S. PATENT DOCUMENTS 5,059,976 A  10/1991  Ono et al.

(Continued)

FOREIGN PATENT DOCUMENTS

EP  1 158 774 A2  11/2001

(Continued)

OTHER PUBLICATIONS

Information Technology, JPEG 2000 Image Coding System, JPEG 2000 Part I with Cor.1, Cor.2, Cor.3 and DCor.4, Amd.1, FPDAM.2, May 7, 2002, pp. 1-234.

(Continued)

*Primary Examiner*—Scott A. Rogers
(74) *Attorney, Agent, or Firm*—Birch, Stewart, Kolasch & Birch, LLP

(57) ABSTRACT

Even in the case of coding the input image by dividing into tiles, a fine image quality adjustment is possible based on the characteristic of each tile. The input image signal is transformed to the coded data through the tile dividing unit 102, the wavelet transforming unit 103, and the entropy coding unit 106, and is stored in the code memory 107. In parallel to this processing, the distortion calculating unit 108 calculates the distortion in each coding pass of each code block, and stores it in the distortion memory 109. On the other hand, the complex tile deciding unit 111 decides whether a particular tile is the complex tile or not. The tile classifying memory 112 stores the decision output. A distortion data outputted from the distortion memory 109 is outputted to the multiplier 110, the multiplier 110 multiplies the distortion data by the weight coefficient selected by the weight coefficient selecting unit 113. The weighted distortion of each coding pass is output to the rate controlling unit 114, the rate controlling unit 114 executes code amount control of coded data.

8 Claims, 11 Drawing Sheets

U.S. PATENT DOCUMENTS

| | | | |
|---|---|---|---|
| 5,307,062 | A | 4/1994 | Ono et al. |
| 5,307,163 | A | 4/1994 | Hatano et al. |
| 5,404,140 | A | 4/1995 | Ono et al. |
| 5,432,556 | A | 7/1995 | Hatano et al. |
| RE35,781 | E | 5/1998 | Ono et al. |
| 5,959,675 | A | 9/1999 | Mita et al. |
| 6,075,619 | A | 6/2000 | Iizuka |
| 6,549,674 | B1 * | 4/2003 | Chui et al. ............... 382/240 |
| 6,876,772 | B2 | 4/2005 | Fukuhara et al. |
| 6,956,974 | B1 * | 10/2005 | Ito et al. .................. 382/240 |

FOREIGN PATENT DOCUMENTS

| | | | |
|---|---|---|---|
| JP | 2-308672 | A | 12/1990 |
| JP | 3-291058 | A | 12/1991 |
| JP | 7-154798 | A | 6/1995 |
| JP | 8-172626 | A | 2/1996 |
| JP | 2001-217718 | A | 8/2001 |
| JP | 2001-326936 | A | 11/2001 |
| JP | 2002-064719 | A | 2/2002 |
| JP | 2002-101311 | A | 4/2002 |
| JP | 2002-165098 | A | 6/2002 |
| JP | 2003-23544 | A | 1/2003 |
| JP | 2003-101794 | A | 4/2003 |
| JP | 2003-116007 | A | 4/2003 |

OTHER PUBLICATIONS

Information Technology, JPEG 2000 Image Coding System, JPEG 2000 Part I with Cor.1, Cor.2, Cor.3 and DCor.4, Amd.1, FPDAM.2, May 7, 2002, pp. 1-234.

* cited by examiner

| TILE NUMBER | COLOR | SUB BAND | CODE BLOCK | CODING PASS | DISTORT |
|---|---|---|---|---|---|
| 0 | 0 | 0LL | 0 | 0 | 10 |
| 〃 | 〃 | 〃 | 〃 | : | : |
| 〃 | 〃 | 〃 | 〃 | 22 | 12 |
| 〃 | 〃 | 〃 | 1 | 0 | 8 |
| 〃 | 〃 | 〃 | 〃 | : | : |
| 〃 | 〃 | 〃 | 〃 | 20 | 2 |
| 〃 | 〃 | 1HL | 0 | 0 | 23 |
| 〃 | 〃 | 〃 | : | : | : |
| 〃 | 〃 | 2HH | 0 | 0 | 5 |
| 〃 | 〃 | 〃 | : | : | : |
| 〃 | 1 | 0LL | 0 | 0 | 10 |
| 〃 | : | : | : | : | : |
| 1 | 0 | 0LL | 0 | 0 | 15 |
| : | : | : | : | : | : |

(b)

| TILE NUMBER | TILE CATEGORY |
|---|---|
| 0 | 0 |
| 1 | 0 |
| 2 | 1 |
| : | : |

(c)

| TILE CATEGORY | COLOR | SUB BAND | WEIGHT COEFF |
|---|---|---|---|
| 0 | 0 | 0LL | 1.0 |
| 〃 | 〃 | 1HL | 0.5 |
| 〃 | 〃 | : | : |
| 〃 | 〃 | 2HL | 0.1 |
| 〃 | 1 | 0LL | 1.0 |
| : | : | : | : |
| 1 | 0 | 0LL | 1.0 |
| 〃 | 〃 | : | : |
| 〃 | 〃 | 2HL | 0.1 |
| 〃 | 1 | 0LL | 1.0 |
| : | : | : | : |

| At (-2,-2) | At (-1,-2) | At (0,-2) | At (1,-2) | At (2,-2) |
|---|---|---|---|---|
| At (-2,-1) | At (-1,-1) | At (0,-1) | At (1,-1) | At (2,-1) |
| At (-2, 0) | At (-1, 0) | At (0, 0) | At (1, 0) | At (2, 0) |
| At (-2, 1) | At (-1, 1) | At (0, 1) | At (1, 1) | At (2, 1) |
| At (-2, 2) | At (-1, 2) | At (0, 2) | At (1, 2) | At (2, 2) |

| At (-1, -1) | At (0, -1) | At (1, -1) |
| --- | --- | --- |
| At (-1, 0) | At (0, 0) | At (1, 0) |
| At (-1, 1) | At (0, 1) | At (1, 1) |

| 0 | 0 | 1 |
|---|---|---|
| 0 | 1 | 0 |
| 1 | 0 | 0 |

| 1 | 0 | 0 |
|---|---|---|
| 0 | 1 | 0 |
| 0 | 0 | 1 |

IMAGE CODING DEVICE IMAGE CODING METHOD AND IMAGE PROCESSING DEVICE

FIELD OF THE INVENTION

The present invention relates to the image coding device, the image coding method, and the image processing device, for dividing an input image into tiles of the pre-determined size, for transforming an image signal included in the individual tile to the frequency component, for quantizing the transformation coefficient obtained, for entropy coding the quantized coefficient, at the same time, for calculating a quantized distortion, and controlling a code amount of the coded data which is entropy coded using the quantized distortion.

RELATED ARTS

Currently, the static image code algorithm JPEG is widespread particularly on the Internet. On the other hand, the JPEG2000 project has newly started in 1997, as the next generation coding system, by the congruent organization of ISO and ITU, responding to the requirements of additional function and further efficiency improvement. In December of the year 2000, the principal technical contents regarding the part 1 which defines the basic system of JPEG2000 algorithm that determines its basic system, have been determined.

In regard to the coding algorithm of JPEG2000, since the color coordinates transformation is performed to an input image signal, followed by the tile division and then the wavelet transformation, a linear distortion (image quality degradation) appears at the tile border when the coding rate is lowered, such that the smoothness is impaired in the resulting image.

Because of that, for example, in the conventional image processing device, in order to control the distortion which occurs in the tile border such as this, when extending insufficient data at the tile border in the wavelet transformation processing, the point object extending method is jointly used to control the linear distortion existing at the tile border, in addition to the object extending method defined in JPEG2000.

But, in the case of this conventional image processing device, the two extending methods are controlled by switching from one to the other, such that it is necessary to imbed in the coded data which extending method is being used. This does not only leads to a problem of the increased amount of coded data, but it also causes a problem of failing to maintain the compatibility since it exceeds the range of the standard of the JPEG2000.

In addition to that, the distortion of the tile border such as this especially, is conspicuous in the area where there is no object such as background area and the area where a texture is less. Originally in the background area, a small fluctuation signal of the level close to the noise is included barely as the texture (hereinafter referred to as fluctuation texture). However, when one compares the background area and the complex area where the object exists, there is a tendency where in the background area that a high pass component at the time of wavelet transformation is extremely less. Most of the high pass components of this background area are removed by the rate control function forming the final code data, and this fact is considered to make the distortion more conspicuous. Therefore, the sub band that corresponds to this fluctuation texture is detected, the high weight is set to that sub band by using the frequency weighting (frequency Weighting), and barely existing texture is reconstructed, and the tile border is likely be controlled by the dithering effect. But, this method adapts the identical processing to all tiles, even setting a high weight to the tile that does not originally require the high weight setting. On the contrary, a relatively low weight is set to the area of visual importance, and the image quality of that part may likely to decrease. In other words, in order to control the distortion which occurs in the tile border, if the same frequency weighting processing is applied to all tiles, perhaps the tile border may be controlled, but, there is a problem that image quality degradation may occur at other visually important areas.

This point is attempted to verify with experiment. It is understood that, provided that a frequency of wavelet transformation is designated as "n", concerning the texture of the background area, the sub band of the resolution level "n−1" has a large contribution graphically. Here, the resolution level "n" represents the sub band of the highest resolution. At this time, an emphasis processing is carried out on the sub band of the resolution level "n−1" by the frequency weighting, and the similar effect as dithering is exhibited through the fact that this texture is reconstructed, and the distortion occurring at the tile border is controlled. On the other hand, the problem of zig-zag (jaggy) becomes conspicuous especially at the edge part having the inclined directivity where the resolution is high. As for this, it is nothing more than that the information of the resolution level "n" having the high resolution is being deleted upon prioritizing the information of the sub band of the resolution level of "n−1".

In addition to that, JPEG2000 prepares a rate control function which controls the final amount of coded data within a fixed range, and supplies the highest image quality based on the mean squared error within the fixed range. But, when the actual playback image is viewed, there is a problem of not being able to reconstruct a favorable image visually, despite of the error being low. For example, when coding an image of the face of the person, a fine texture of the skin is removed, and the image becomes plain lacking in a fine degree of definition. This is because the high pass component of the wavelet transformation coefficient is difficult to have an influence on the image quality in comparison to the low pass component, and therefore, the information of this part is prioritized and deleted by the rate control function. For this kind of problem, the frequency weighting explained previously is effective. For example, in order to reconstruct the texture of the skin of the person, the sub band of the wavelet transformation area that corresponds to this texture is detected, the weight of that sub band is set high, and a satisfactory texture is reconstructed. But, this method adapts the identical processing to all tiles, even setting a high weight to the tile that does not originally require the high weight setting. On the contrary, a relatively low weight is set to the area of visual importance, and the image quality of that part may likely to decrease. In other words, when the same frequency weighting processing is applied equally to all tiles in order to improve the reconstruction of fine texture such as skin of a person, perhaps the high quality may be possible at the part of the skin of person, but there is a problem of image quality degradation occurring at other visually important areas.

This point is attempted to verify with experiment. It is understood that, provided that a frequency of wavelet transformation is designated as "n", concerning the texture of the face (skin) of the person, the sub band of resolution level "n−1" has a large contribution graphically. When, an emphasis processing is carried out on the sub band of the resolution level "n−1" by the frequency weighting, and although the skin is reconstructed favorably, however, it caused the problem of zig-zag (jaggy) to become conspicuous especially at the hair part having the inclined directivity. As for this, it is nothing more than that the information of the resolution level "n" having high resolution, such as hair, is being deleted by prioritizing the information of the sub band of the resolution level of "n−1".

Accordingly, the present invention attempts to solve these problems. The present invention aims to supply the image coding device, the image coding method, and the image processing device, in the case of coding an input image by tile division, for flexibly controlling the coding rate of the image signal depending on the tiles, for allowing a finer image adjustment responsive to the characteristic of each tile, and for supplying a satisfactory overall playback image.

DISCLOSURE OF THE INVENTION

In order to attain these objectives, according to one aspect of the present invention, an image coding device for dividing an input signal into tiles of a certain size, for transforming an image signal included in each tile to a frequency component and obtaining a transformation coefficient, for quantizing an obtained transformation coefficient to a qunatized coefficient, for entropy coding the qunatized coefficient, for calculating a quantized distortion upon quantizing of the transformation coefficient, and for controlling a code amount of a coded data obtained by the entropy coding using the quantized distortion, which comprises a tile classifying unit for classifying each tile based on its characteristic into a plurality of categories by referring to the transformation coefficient, and for outputting a classified result; a weighting unit for weighting the quantized distortion based on an output of the tile classifying unit; and a rate controlling unit for controlling the code amount of a code data obtained by the entropy coding, based on the quantized distortion weighted by the weighting unit.

According to another aspect of the present invention, an image coding method for dividing an input signal into tiles of a certain size, for transforming an image signal included in each tile to a frequency component and obtaining a transformation coefficient, for quantizing an obtained transformation coefficient to a qunatized coefficient, for entropy coding the qunatized coefficient, for calculating a quantized distortion upon quantizing of the transformation coefficient, and for controlling a code amount of a coded data obtained by the entropy coding using the quantized distortion, comprises the steps of classifying each tile based on its characteristic into a plurality of categories by referring to the transformation coefficient and weighting the quantized distortion with a weight coefficient for each category; and controlling the code amount of a code data obtained by the entropy coding, based on the quantized distortion weighted with the weight coefficient.

According to another aspect of the present invention, an image processing device comprises the image coding device of claim 1, for processing the coded data where the code amount is controlled by the image coding device.

BRIEF DESCRIPTION OF THE DRAWINGS

FIG. 4 shows one example of storing data in a distortion memory 109, a tile classifying memory 112, and the weight coefficient selecting unit 113.

FIG. 13 shows one example of a binary pattern in an inclined direction stored beforehand in an inclined pattern storing unit 1002 of Embodiment 5.

FIG. 14 shows one example of a binary pattern in an inclined direction stored beforehand in an inclined pattern storing unit 1002 of Embodiment 6.

PREFERRED EMBODIMENTS OF THE PRESENT INVENTION

Embodiment 1

Figure 1:
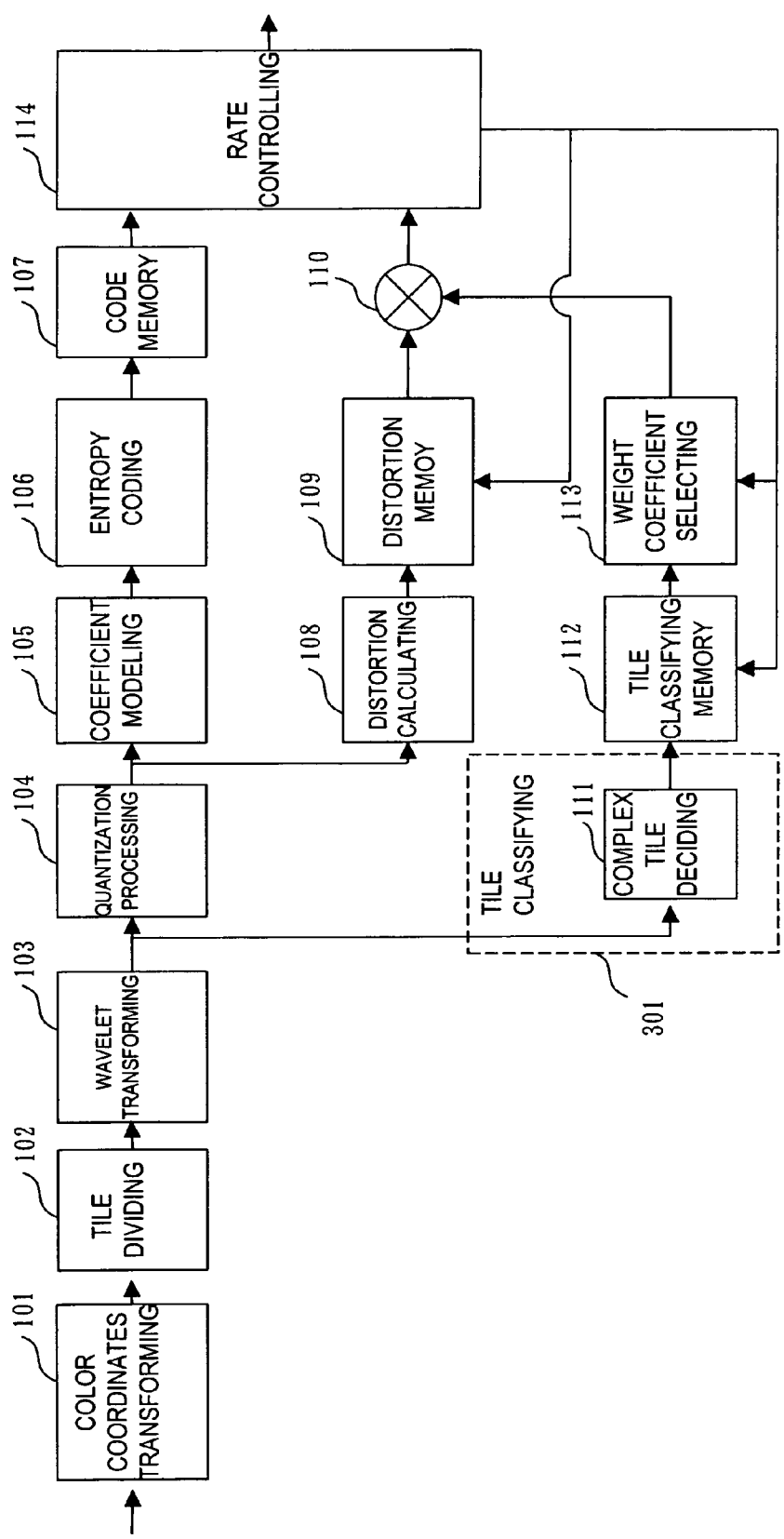
FIG. 1 shows a block chart of configuration of an image coding device of Embodiment 1.

In FIG. 1 shows a block chart of an image coding device of Embodiment 1. Referring to FIG. 1, the reference numeral 101 denotes a color coordinates transforming unit for transforming the color spatial coordinates, from RGB signals to YCbCr and the like, as required. The reference numeral 102 denotes a tile dividing unit for dividing each color component signal into a plurality of rectangular shapes called tiles. The reference numeral 103 denotes a wavelet transforming unit for executing the two dimensional wavelet transformation. The reference numeral 104 denotes a quantization processing unit to quantize a wavelet transformation coefficient generated at the wavelet transforming unit based on a quantization step size being set. The reference numeral 105 denotes a coefficient modeling unit for modeling a quantized wavelet transformation coefficient for a binary arithmetic coding. The reference numeral 106 denotes an entropy coding unit for performing an entropy coding based on the arithmetic coding. The reference numeral 107 denotes a code memory for storing code data that is entropy coded. The reference numeral 108 denotes a distortion calculating unit for calculating a distortion in an unit of the entropy coding. The reference numeral 109 denotes a distortion memory for storing distortion data calculated at the distortion calculating unit 108. The reference numeral 110 denotes a multiplier for multiplying a desired weight coefficient and the distortion data output from the distortion memory 109. The reference numeral 111 denotes a complex tile deciding unit for deciding whether or not a tile is a complex tile including many complex textures based on the wavelet transformation coefficient of each tile. The reference numeral 112 denotes a tile classifying memory for storing an output of the complex tile deciding unit 111. The reference numeral 113 denotes a weight coefficient selecting unit, for selecting a corresponding weight coefficient from a plurality of weight coefficients that are being stored beforehand, based on an output of the tile classifying memory 112. The reference numeral 114 denotes a rate controlling unit for selecting a necessary data from the code data stored in the code memory 107 by considering a weighted distortion data output from the multiplier 110, and for controlling a rate so as to be within a target code amount being set. The reference numeral 301 denotes a tile classifying unit including the complex tile deciding unit 111. As for the configuration of FIG. 1, note that the weighting unit of the present invention is formed by the weight coefficient selecting unit 113 and the multiplier 110.

The operation shall be described next.

In regard to an image signal being input from an image inputting device which is not illustrated, such as image scanner or digital camera, alternatively, a network or memory media, the color spatial coordinates transformation is executed at the color coordinates transforming unit 101, as required. Generally, when color RGB signals are input, in the case of lossy compression, a transformation of the luminance signal (Y) and the color difference signals (Cb and Cr) is carried out. In the case of lossless compression, the RCT transformation having no loss is carried out. In addition to that, this color coordinates transforming unit is bypassed when a monochrome image signal is being input.

At the tile dividing unit 102, each color component signal input from the color coordinates transforming unit 101 is divided into a plurality of rectangular areas called tiles. In the later processing, this tile is treated as one image.

In the wavelet transforming unit 103, one tile is regarded as one image, and the two dimensional wavelet transformation is executed, and then a band division into a plurality of sub bands is executed. The two dimensional wavelet transformation is actualized here as combination of one dimensional wavelet transformations. In other words, they are a process where one dimensional wavelet transformation of horizontal direction is consecutively done in every line, and a process where one dimensional wavelet transformation of vertical direction is consecutively done in every line.

Figure 2:
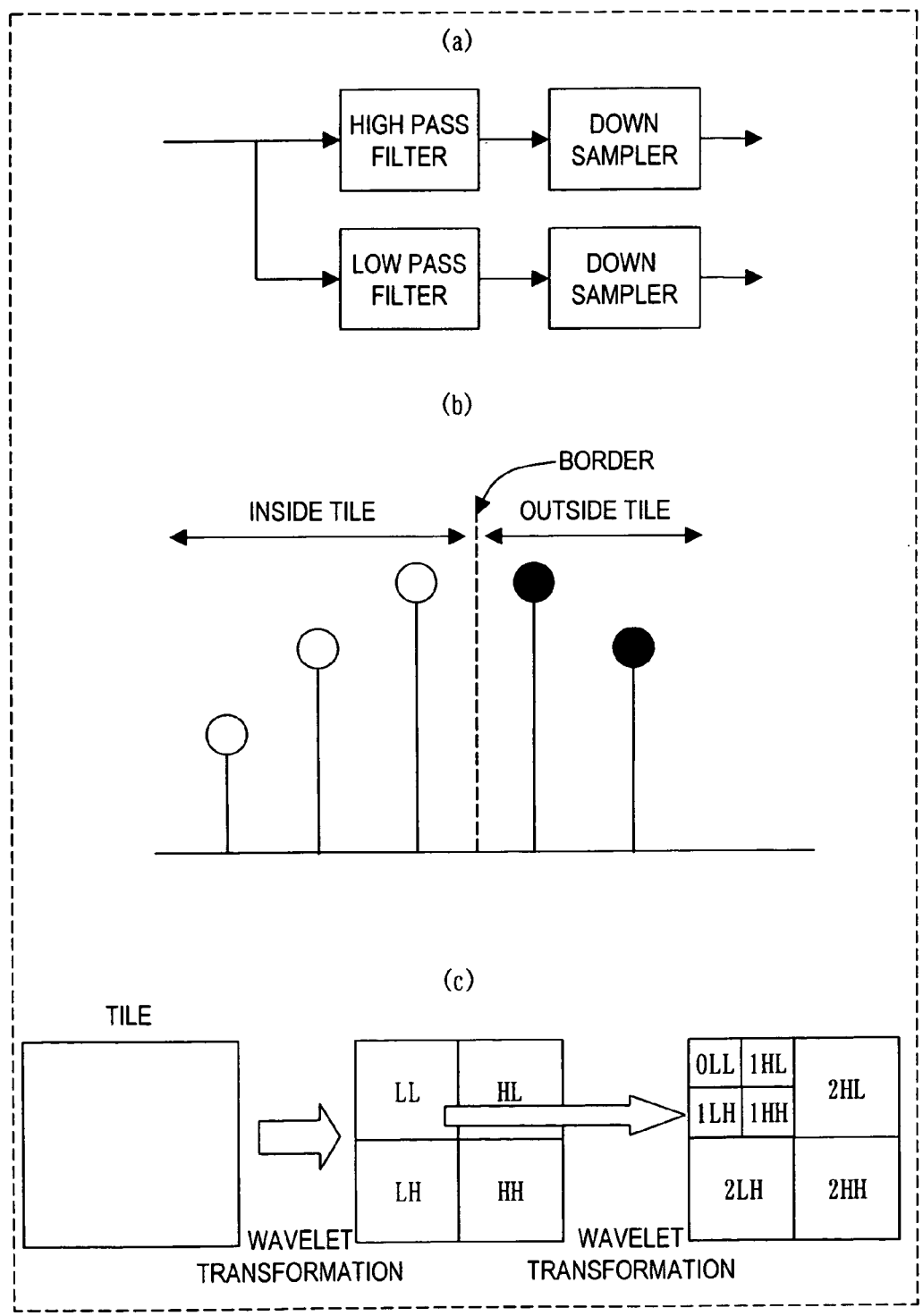
FIG. 2 shows an outlined example of configuration and operation of a wavelet transforming unit 103.

FIG. 2 shows an outline example of configuration and operation of the wavelet transforming unit 103. FIG. 2(a) shows an example of the configuration of one dimensional wavelet transformation component in the wavelet transforming unit 103, and one dimensional wavelet transformation comprises a low pass filter, a high pass filter, and down samplers, carrying pre-determined characteristics. The two dimensional wavelet transformation is actualized as combination of one dimensional wavelet transformations. By the way, a number of taps (coefficients) for these filter processing is 9 for lossy compression low pass filter, 7 for high pass filter, 5 for lossless compression low pass filter, and 3 for high pass filter. For this reason, the data becomes insufficient at the edge of the image, or at the end part of the tile, such that an extension processing is necessary to supplement it. Because of this, in JPEG2000, an extending method (object extension) is used, just like a mirror reflection shown in FIG. 2(b). The two dimensional wavelet transformation coefficient generated accordingly is expressed by the low area component as L and the high area component as H, and the horizontal direction transformation at the 1st letter and the vertical direction transformation at 2nd letter. As a result, these are respectively expressed as the LL, the HL, the LH, and the HH, as shown in FIG. 2(c). In addition to that, these band divided components are called sub bands. Herewith, the wavelet transformation is executed recursively to the low area component (the LL component) in the horizontal and vertical directions. Each sub band that is formed by each recursive wavelet transformation, is termed a resolution level and corresponds to the numbers stated before the LL, the HL, the LH, and the HH in the drawing. That is, the LL component of the lowest resolution always corresponds to the resolution level 0, and in contrast to this, the resolution level of the high pass components HL, LH, and HH of the highest resolution is identical to the number of times of wavelet transformation. In this example shown in the drawing, since the wavelet transformation is carried out twice, the resolution level of the highest resolution component becomes 2.

In the quantization processing unit 104, the wavelet transformation coefficient is quantized based on the quantization step size which is being set for every sub band.

In the coefficient modeling unit 105, after dividing the wavelet transformation coefficient of each sub band into fixed size areas called code blocks, multiple-valued data of the respective code blocks are transformed to the binary bit plane. Furthermore, each bit plane is divided into three kinds of coding passes (the significance pass, the refinement pass, and the cleanup pass). The context modeling of the respective coding passes is performed for the purpose of entropy coding.

As for binary signals output from the three coding passes, the arithmetic coding is done by the entropy coding unit 106.

A coded data which is formed in the entropy coding unit 106 is once stored in the code memory 107.

In parallel to these coding processes, in the distortion calculating unit 108, the distortion is calculated for each coding pass of each code block. Calculated distortion data is stored in the distortion memory 109, after attaching an index that can specify the color component, the tile number, the sub band, the code block, and the coding pass, to the calculated distortion data.

In the complex tile deciding unit 111 of the tile separating unit 301, as an index which displays the degree of complexity, in regard to the HH component of each tile of the luminance component, an average power Pt is calculated using the equation (1) shown below.

$$Pt = \sum_{i=0}^{I\max-1} \sum_{j=0}^{J\max-1} C(i, j)^2 / (I\max \cdot J\max) \quad \text{(Equation 1)}$$

Here, the subscript t represents a tile number. C (i, j) represents a transformation coefficient of the HH component at the position (i, j). Jmax represents a sample number in the horizontal direction of the HH component. Imax represents a sample number in the vertical direction.

Next, a certain threshold value Tp is set, and a category of a particular tile is decided, if it is the complex tile or the simple tile, in accordance to the decision equations shown below.

| If (Pt > Tp) | complex tile |
| Else | simple tile |

Output of the complex tile deciding unit 111 is once stored in the tile classifying memory 112.

As the result of the processing above, the code data is stored in the code memory 107, the distortion data is stored in the distortion memory 109, and the tile category is stored in the tile classifying memory 112, which are to be stored over all tiles. Making use of these items of information, the rate control is executed in the rate controlling unit 114.

Herewith, the rate controlling method is explained.

The code data is extracted per coding pass, while satisfying simultaneously two conditions of that sum total of the distortion which is read out from the distortion memory 109 must be smallest and that the total code amount must be under the target code amount. For the optimized calculation which can make these two conditions satisfy simultaneously, it is solved by using Lagrange's method of the undetermined multipliers. Now, given that the distortion per coding pass is Di, and the code amount per coding pass is Ri, for a certain value λ, $$\Sigma(Ri+\lambda Di) \qquad \text{(Equation 2)}$$

the position i of the coding pass is calculated so that a result of the equation (2) becomes minimum. The λ is repeatedly adjusted so that the total code amount R reaches the target code amount at this time.

$$R=\Sigma Ri \qquad \text{(Equation 3)}$$

Furthermore, the subscript i is cited as the coding pass, but this displays all the color components, all tiles, and the coding pass of all the resolution levels.

Returning to FIG. 1, the distortion data Di of each code pass is output from the distortion memory 109, depending on the index of the coding pass, the code block, the sub band, the tile number, and the color component, which are outputted from the rate controlling section 114. In the multiplier 110, the weight coefficient selected by the weight coefficient selecting unit 113 is multiplied to the distortion data Di of each coding pass.

The weight coefficient selecting unit 113 shall be described in detail with reference to FIG. 3.

Figure 3:
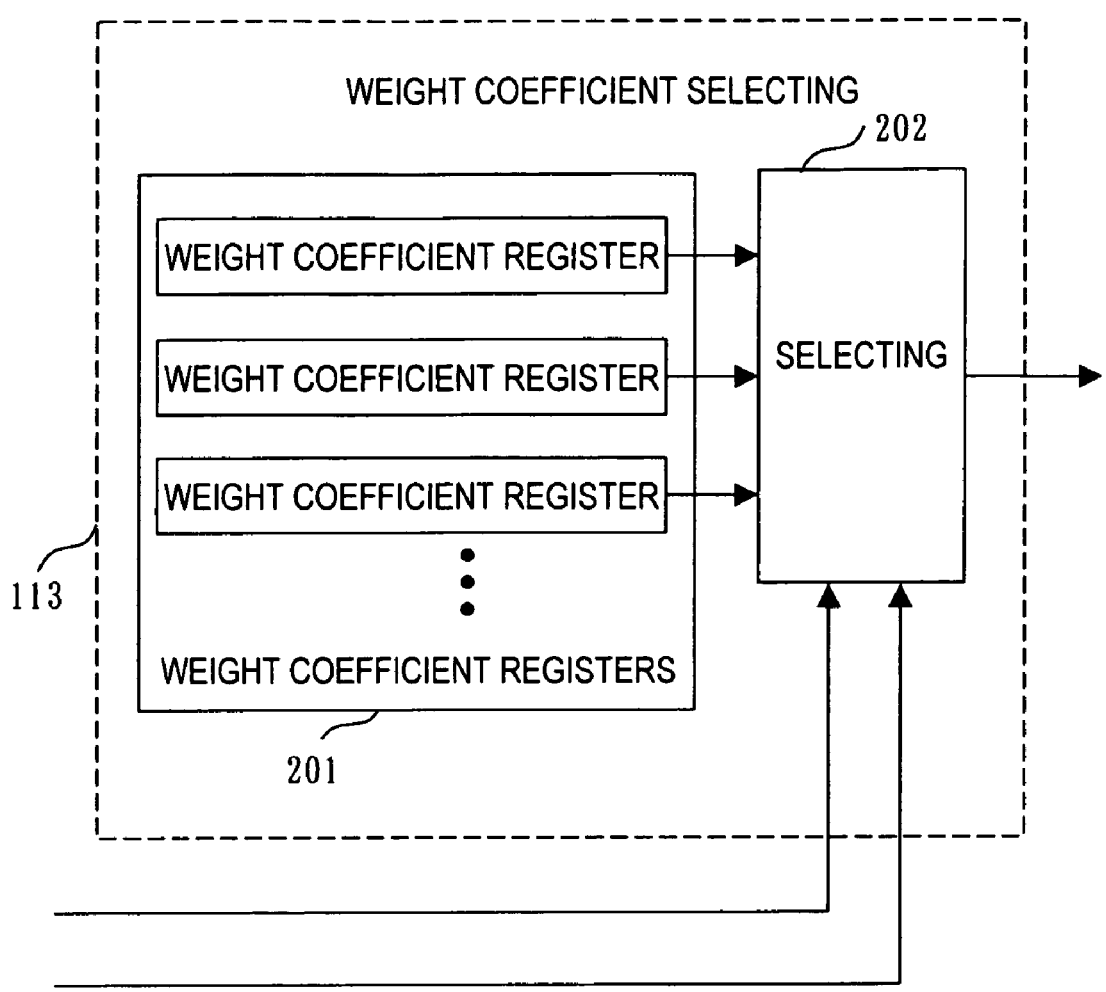
FIG. 3 shows a detailed configuration of a weight coefficient selecting unit 113 of FIG. 1.

FIG. 3 shows the detailed configuration of the weight coefficient selecting unit 113 of FIG. 1. Referring to FIG. 3, the reference numeral 201 denotes a weight coefficient register group for displaying a plurality of registers that store each of a plurality of weight coefficients respectively. The reference numeral 202 denotes a selecting unit for selecting the desired weight coefficient on the basis of the select signal out of the plurality of weight coefficients output from the weight coefficient register group 201. Operation shall be described hereinbelow.

The weight coefficient of each sub band is set to each register of the weight coefficient register group 201, in respect to each of the two tile categories described previously. Therefore, in the case of 3 color components and 3 resolution levels, 3 color components×(3 resolution levels×3 sub bands+1 sub band)×2 tile categories=60 weight coefficients are to be set. First of all, when a tile number which the coding pass belongs to, the coding pass which presently has been about to be processed, is input from the rate controlling unit 114 to the tile classifying memory 112, then the tile category signal which corresponds to that tile number is output, and it is input to the weight coefficient selecting unit 113. As the select signal, the tile category is input from the tile classifying memory 112 to the selecting unit 202 of the weight coefficient selecting unit 113, and the index which shows the sub band and the color component which the coding pass belongs to, the coding pass which presently has been about to be processed, are input from the rate controlling unit 114 to the selecting unit 202 of the weight coefficient selecting unit 113. Therefore, the selecting unit 202 selects the corresponding weight coefficient on the basis of these input select signals, and outputs the selected weight coefficient to the multiplier 110. In the multiplier 110, as mentioned previously, the weight coefficient which is selected at the weight coefficient selecting unit 113 is multiplied to the distortion data Di of each coding pass, and output. Furthermore, one example of data storing methods in the distortion memory 109, that in the tile classifying memory 112, and that in the weight coefficient register group 201 are respectively illustrated in the drawings of FIGS. 4(a), (b), and (c).

In this way, the weighted distortion Di of each coding pass is outputted from the multiplier 110 of FIG. 1 to the rate controlling unit 114. The rate controlling unit 114 performs rate controlling, that is, adjusts the code amount so that the data of the coded data from the code memory 107 can be under the target code size, based on the weighted distortion Di of each coding pass, which is input from the multiplier 110, and provides the highest image quality which can be reconstructed within that target code size.

In other words, as for Embodiment 1, as mentioned before, in parallel to the entropy coding process at the entropy coding unit 106, in the distortion calculating unit 108, the square mean of the error during quantization of each coding pass is calculated as the distortion. And the weight coefficient for each tile category is multiplied to this distortion, so in the rate controlling unit 114, in order for the distortion multiplied by this weight coefficient to become minimum, the coded data is selectively acquired in each coding pass, and the highest image quality at the target code amount is provided by trying to settle the total code amount within the target code size. Furthermore, in order to simultaneously satisfy the two conditions of smallest distortion and under the target code amount, the optimization calculation becomes necessary, but as mentioned previously, Lagrange's method of the undetermined multipliers is utilized.

Like above, in Embodiment 1, each tile is classified into two categories of the complex tile and the simple tile based on its characteristic. And, it becomes possible to set weight on every sub band to suit the respective tile categories. Because of this, in comparison to the conventional system of uniform weight setting over all tile, there is an advantage that a finer image quality adjustment becomes possible, due to the fact that flexibility of the image quality setting has improved.

As a result of this, for example, in the case of wanting to control a linear distortion which occurs at the tile border, in order to leave a fine fluctuation texture that exists in the background area, a high weight is set to the sub band component corresponding to the fluctuation texture, for simple tile identified as the background area. On the other hand, for those complex tile not identified as the background area, because there is a high possibility that the amount of information being allotted more than necessary, therefore, a low weight is set to the high pass component having a relatively low degree of importance for the complex tile. This way, there is an effect that the tile border is controlled, by allocating the amount of information obtained from the complex tile to the sub band which corresponds to the fluctuation texture of the simple tile.

Embodiment 2

Figure 5:
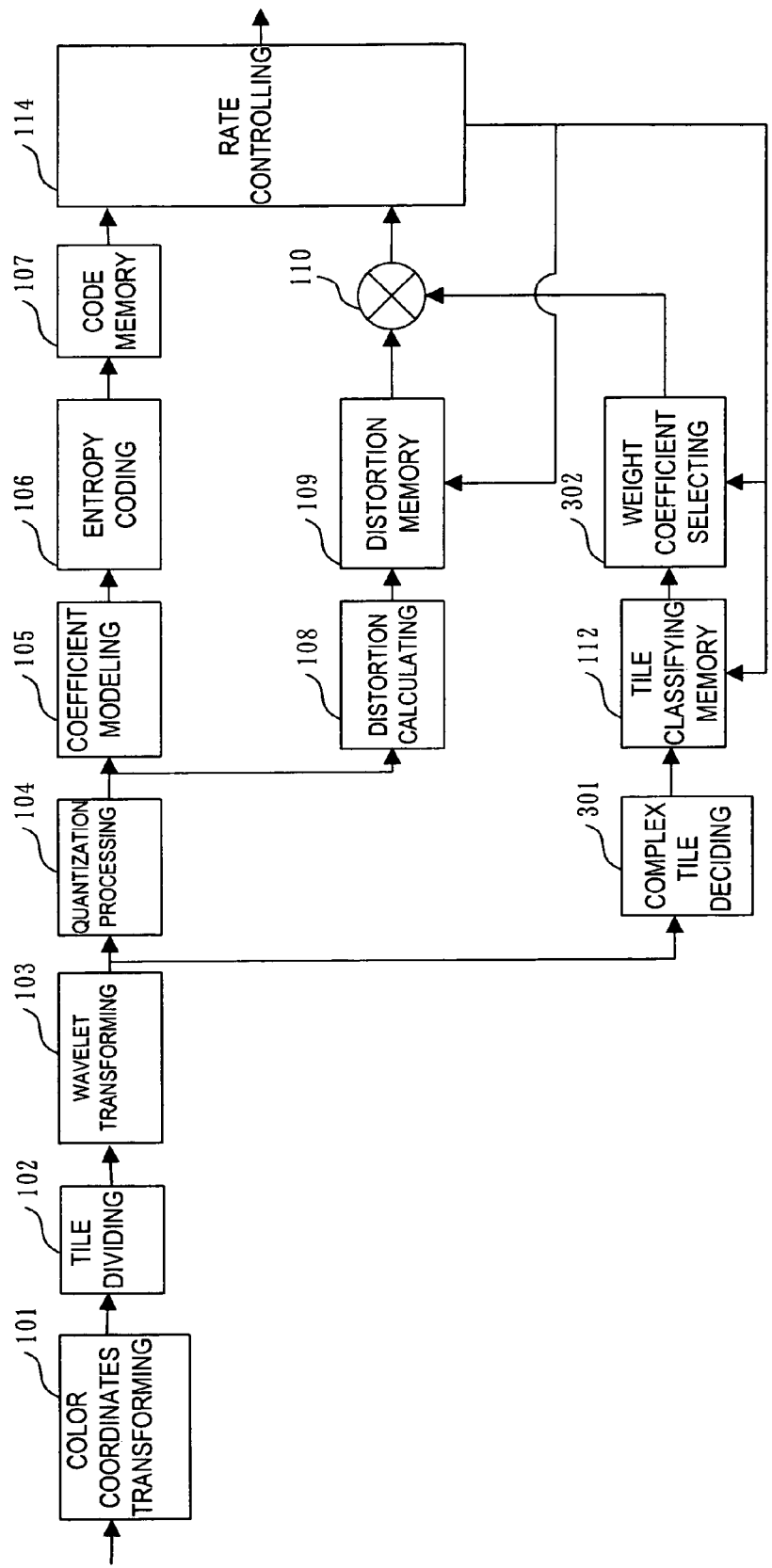
FIG. 5 shows a block chart of the configuration of an image coding device of Embodiment 2.

FIG. 5 shows a block chart of an image coding device of Embodiment 2.

Referring to FIG. 5, note that there are blocks having identical reference numerals as FIG. 1, and the operation of these blocks are completely same as those explained in Embodiment 1. What differentiate FIG. 5 from FIG. 1 are a tile classifying unit 301 and a weight coefficient selecting unit 302. This tile classifying unit 301 classifies into three categories based on the characteristic of each tile. The weight coefficient selecting unit 302 selects the desired weight coefficient among the weight coefficients corresponding to the three categories.

Herewith, the tile classifying unit 301 is described in detail with reference to FIG. 6.

Figure 6:
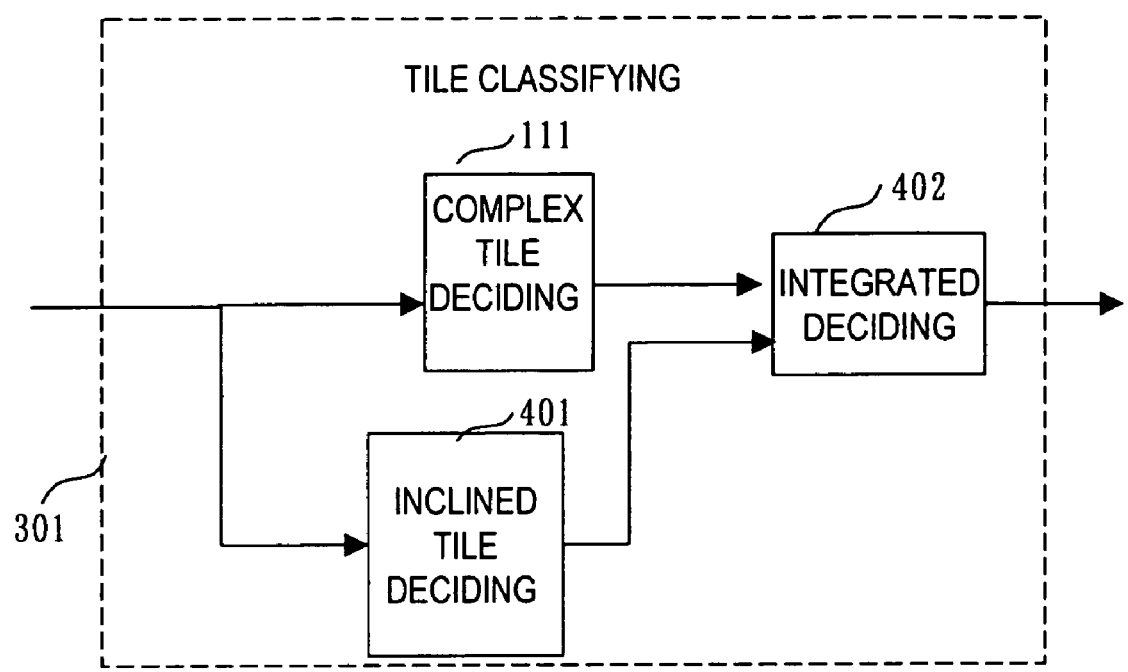
FIG. 6 shows a detailed configuration of a tile classifying unit 301 of Embodiment 2.

FIG. 6 shows a detailed configuration of the tile classifying unit 301. In the same drawing, the reference numeral 111 is identical to the complex tile deciding unit 111 of FIG. 1, which is a complex tile deciding unit for deciding whether or not a particular tile is the complex tile. The reference numeral 401 denotes an inclined tile deciding unit which decides whether or not a particular tile is the inclined tile. The reference numeral 402 denotes an integrated deciding unit for receiving the outputs of the complex tile deciding unit 111 and the inclined tile deciding unit 401, and for deciding whether or not a particular tile corresponds to one of the tile categories of the complex tile, the simple tile, and the inclined tile.

Next, the operation shall be described.

The complex tile deciding unit 111 does the completely identical operation as the operation explained in Embodiment 1.

Next, the inclined tile deciding unit 401 shall be described with reference to FIG. 7.

Figures 7, 8:
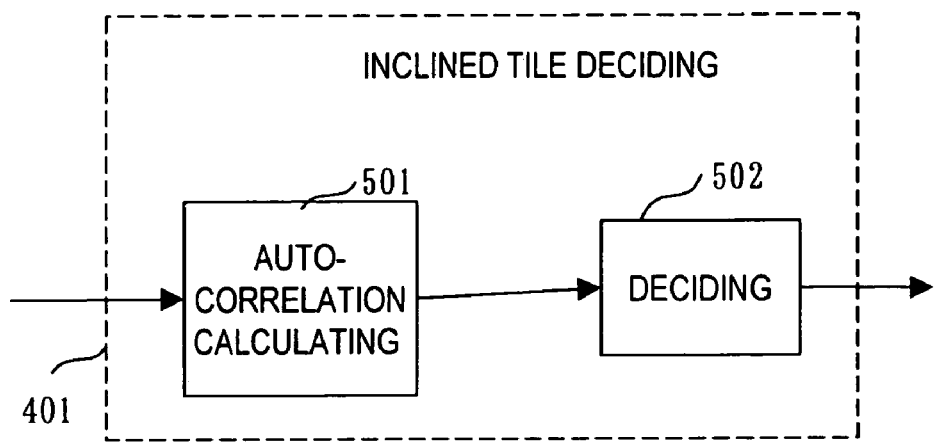
FIG. 7 shows a detailed configuration of an inclined tile deciding unit 401 of Embodiment 2.
FIG. 8 shows one example of an auto-correlation coefficient of an auto-correlation calculating unit 501.

FIG. 7 shows a detailed configuration of the inclined tile deciding unit 401. Referring to FIG. 7, the reference numeral 501 denotes an auto-correlation calculating unit which calculates the auto-correlation coefficient of the desired sub band. The reference numeral 502 denotes a deciding unit for deciding whether or not a particular tile is the inclined tile based on the auto-correlation coefficient which is an output of the auto-correlation calculating unit 501.

The operation shall be described next. The auto-correlation calculating unit 501 calculates the auto-correlation coefficient At by using the equation (4) shown below, for the HH component having the resolution level n (the highest resolution) of the highest resolution in each tile.

$$At(x, y) = \sum_{i=0}^{I\max-1} \sum_{j=0}^{J\max-1} C(i, j) \cdot C(i + x, j + y)(I\max \cdot J\max) \quad \text{(Equation 4)}$$

Herewith, the subscripts x and y represent the position of the auto-correlation coefficient, and these are integers that satisfy $-2 \leq x \leq 2$, $-2 \leq y \leq 2$, respectively. Specifically, At (x, y) represents the position of the auto-correlation coefficient of the position shown in FIG. 8.

The deciding unit 502 decides whether or not a particular tile is the inclined tile having a strong correlation in the inclined direction, by using the auto-correlation coefficient At (x, y). Firstly, among the 25 auto-correlation coefficients At (x, y), those that have a negative value is reset to 0. Sum 1 and sum 2 for the coefficient At (x, y) after reset are respectively calculated by using the following decider equations (5) and (6).

Sum1=At(-2,-2)+At(-1,-2)+At(-2,-1)+At(-1,-1)+At(0,-1)+At(-1,0)+At(0,0)+At(1,0)+At(0,1)+At(1,1)+At(2,1)+At(1,2)+At(2,2); (Equation 5)

Sum2=At(2,-2)+At(1,-2)+At(2,-1)+At(1,-1)+At(0,-1)+At(1,0)+At(0,0)+At(-1,0)+At(0,1)+At(-1,1)+At(-2,1)+At(-1,2)+At(-2,2); (Equation 6)

The ratio between sum 1 and sum 2, and the threshold value Ta which is worked out from experiences such as experiments and simulations, are compared. For example, as shown below, if the ratio between sum 1 and sum 2 is greater than the threshold value Ta, then a particular tile is decided as the inclined tile. If the ratio between sum 1 and sum 2 is smaller than the threshold value Ta, then a particular tile is decided as the non-inclined tile.

| | |
|---|---|
| If(sum1/sum2 > Ta) or (sum2/sum1 > Ta) | inclined tile |
| Else | non-inclined tile |

Figure 9:
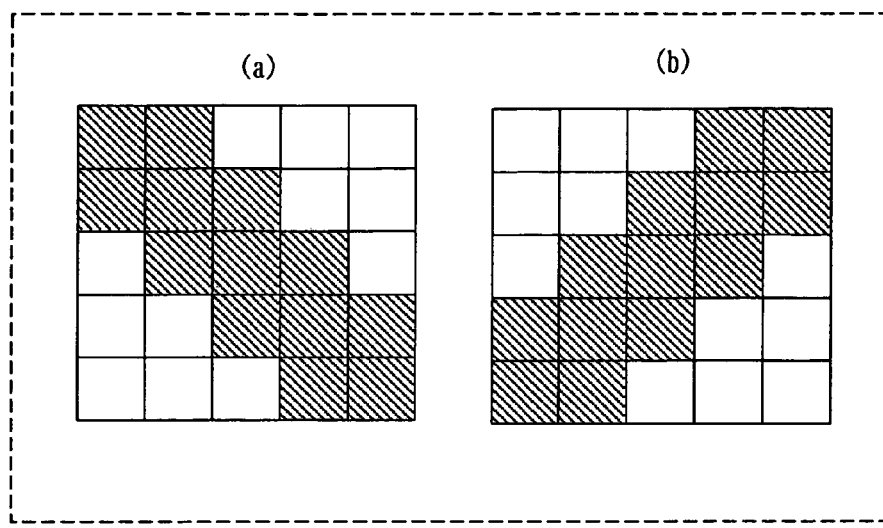
FIG. 9 shows a chart for simply explaining which auto-correlation coefficients are summed for calculation of sum 1 and sum 2.

FIG. 9 is a chart simply explaining which auto-correlation coefficients are summed for calculation of the sum 1 and the sum 2, respectively. In FIG. 9(a), a sum of the auto-correlation coefficients of the right side going down indicated by shade, shows the sum 1. In FIG. 9(b), a sum of the auto-correlation coefficients of the right side going up indicated by shade, shows the sum 2. In the present decision, if there is any deviation in one of the sum 1 or the sum 2, then it is decided as the inclined tile.

Returning to FIG. 6, the integrated deciding unit 402 receives the decision outputs of the complex tile deciding unit 111 and the inclined tile deciding unit 401. For example, as shown below, if there is no input of the decision output of the complex tile, the category is decided as the simple tile. And, if there is an input of the decision output of the complex tile, then depending on the availability of an input of the decision output of the inclined tile, the category is decided as the complex tile if there is no input of the inclined tile. The category is decided as the inclined tile if there is an input of the inclined tile. The integrated deciding unit 402 decides the category of a particular tile as either one of the complicated tile, the simple tile, and the inclined tile.

| | |
|---|---|
| if(complex tile)   { | |
| if(inclined tile) | . . . inclined tile |
| else | . . . complex tile |
| } | |
| else | . . . simple tile |

Here, it is understood that a tile to be finally decided as the inclined tile has the condition that the average power of the HH component is relatively high.

With the configuration above, when the focused tile is classified to either one of the categories of the complex tile, the simple tile, and the inclined tile, then that signal is once stored in the tile classifying memory 112.

The weight coefficient selecting unit 302 of Embodiment 2 beforehand stores the weight coefficients of every sub band corresponding to the complex tile, the simple tile, and the inclined tile. The weight coefficient selecting unit 302 regards the tile category of the focused tile from the tile classifying memory 112 and the index showing the color component and sub band where the coding pass belongs, the coding pass of which presently has been about to be processed, from the rate controlling unit 114, as the select signal. And the weight coefficient selecting unit 302 selects the weight coefficients of every sub band based on the select signal.

Accordingly, the weight coefficient that corresponds to the distortion data outputted from the distortion memory 109, is selected in the weight coefficient selecting unit 302, and is output to the multiplier 110. At the multiplier 110, the distortion data and the corresponding weight coefficient is multiplied, and after that, in the rate controlling unit 114, in the similar manner as Embodiment 1, the code amount of the coded data is controlled; namely, the rate control is performed.

Like above, according to Embodiment 2, each tile is classified into three categories of the complex tile, the simple tile, and the inclined tile, based on its characteristic. And, it becomes possible to set weight to every sub band suitable for the respective tile categories. Because of this, similar to the case of Embodiment 1, in comparison to the conventional method of setting uniform weight over all tiles, since flexibility of the image quality setting has improved further, there is an effect that a finer image quality adjustment becomes possible.

Especially, flexibility in the image quality setting improves due to the fact that the tile category has increased to 3 types including the complex tile, the simple tile, and the inclined tile, in comparison to Embodiment 1, there is an effect that a finer image quality adjustment becomes possible. For example, in the case of tile dividing and coding of an image where inclined lines and inclined edges exist mostly in the original image, for example, for the simple tile, a high weight is set to the sub band which corresponds to the fluctuation texture of the background area. For the complex tile, a low weight is set to the related sub band. Further, for the inclined tile, a high weight is set to the inclined component., in other words, particularly to the HH component. This way, there is an effect that the line distortion occurring at the tile border can be controlled not only that but a satisfactory image can be reconstructed without the jaggy appearance even for the tile where many inclined edges exist.

Embodiment 3

The basic configuration block diagram is identical to the one explained in FIG. 5 of Embodiment 2. The configuration of the tile classifying unit 301 of FIG. 5 is different in Embodiment 3. Specifically, a flesh color tile detection processing is newly added. Hereinbelow, the configuration and operation of the tile classifying unit of Embodiment 3 is described with reference to FIG. 10.

Figure 10:
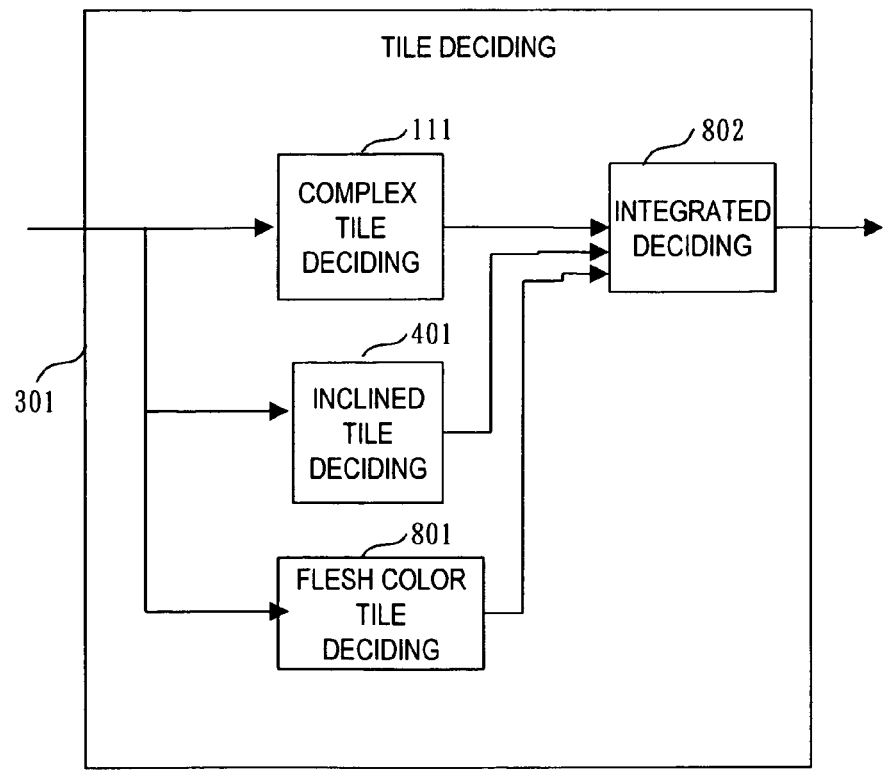
FIG. 10 shows a detailed configuration of a tile deciding unit 301 of Embodiment 3.

FIG. 10 shows the detailed configuration of the tile deciding unit 301 of Embodiment 3. Referring to FIG. 10, the reference numeral 111 denotes a complex tile deciding unit which is same as those shown in FIGS. 1 and 6. The reference numeral 401 denotes a inclined tile deciding unit which is same as that shown in FIG. 6. The reference numeral 801 denotes a flesh color tile deciding unit for detecting whether or not a particular tile contains much flesh color. The reference numeral 802 denotes an integrated deciding unit for receiving the outputs of the complex tile deciding unit 111, the inclined tile deciding unit 401, and the flesh color tile deciding unit 801, and for deciding whether or not a particular tile corresponds to either one of the 4 categories which shall be described later in the specification.

The operation shall be described next.

First of all, the flesh color tile deciding unit 801 detects whether or not each coefficient is the flesh color. Specifically, the RGB signals are converted to the signal of the HSL color coordinates system at the color coordinates transforming unit 101. When the 0LL component after the wavelet transformation is within the range of a certain threshold value, for all the color components of H (hue), S (chroma), L (lightness), it is decided as the flesh color. Provided that the upper and lower limits of the threshold values for the respective color components are designated as the subscripts max and min, then this decision can be indicated as follows.

| | |
|---|---|
| if( ($H_{min}$ < H(i,j) < $H_{max}$) and ($S_{min}$ < S(i,j) < $S_{max}$) and ($L_{min}$ < L(i,j) < $L_{max}$) ) | flesh color |
| else | non-flesh color |

The flesh color tile deciding unit 801 counts the flesh color coefficients detected accordingly. If the count value is greater than the pre-determined threshold value, then the flesh color tile deciding unit decides it as the flesh color tile and outputs.

Furthermore, the complex tile deciding unit 111 and the inclined tile deciding unit 401 operate in the likewise manner as the cases of Embodiments 1 and 2 described previously.

In the integrated deciding unit 802, the decision outputs of the complex tile deciding unit 111, the inclined tile deciding unit 401, and the flesh color tile deciding unit 801 are input. The integrated deciding unit 802 decides to which category a particular tile belongs among the complex tile, the simple tile, the inclined tile, and the flesh color tile, for example, in a following manner. In other words, if the decision output of the flesh color tile has been input, it is decided as the flesh color tile category. If the decision output of the flesh color tile has not been input, then depending on the availability of the input of the decision output of the complex tile, it is decided as the simple tile category if no decision output of the complex tile is being input. If the decision output of the complex tile is being input, then depending on the availability of the input of the decision output of the inclined tile, it is decided as the complex tile category if no decision output of the inclined tile is being input, and it is decided as the inclined tile category if the decision output of the inclined tile is being input.

```
if (flesh color tile)                  ... flesh color tile
else if (complex tile)   {
   if(inclined tile)   ... inclined tile
   else                 ... complex tile
}
else                                   ... simple tile
```

With the configuration above, if the focused tile is classified as belonging to either one of the complex tile, the simple file, the inclined tile, and the flesh color tile, then that signal is once stored in tile classifying memory 112.

By the way, the weight coefficient selecting unit 302 of Embodiment 3 beforehand stores the weight coefficients of each sub band, corresponding to the complex tile, the simple tile, the inclined tile and the flesh color tile. In the likewise manner as the cases of Embodiments 1 and 2, it is selected by the select signal and the like, showing the tile category and the sub band. Furthermore, in the weight coefficient selecting unit 302 of Embodiment 2 described previously, the weight coefficients corresponding to 3 types of tiles of the complex tile, the simple tile, and the inclined tile are being stored. However, in Embodiment 3, the weight coefficients corresponding to 4 types of tiles of the complex tile, the simple tile, the inclined tile, and the flesh color tile are being stored.

In this way, the weight coefficient which corresponds to the distortion data output from the distortion memory 109, is selected from the weight coefficient selecting unit 302, and is outputted to the multiplier 110. After the distortion data is multiplied to the weight coefficient which corresponds to it at the multiplier 110, the rate control is performed in the rate controlling unit 114.

Like above, according to Embodiment 3, each tile is classified into 4 categories of the complex tile, the simple tile, the inclined tile, and the flesh color tile, based on its characteristic. And, it becomes possible to set weight to every sub band as suit to the respective tile types. Because of this, similar to the cases of Embodiments 1 and 2, a finer image quality adjustment is possible due to the fact that flexibility of the image quality setting has improved in comparison to the conventional system of setting the uniform weight over all tiles.

Especially, by increasing the tile categories to 4 types of the complex tile, the simple tile, the inclined tile, and the flesh color tile, flexibility of the image quality setting has improved, and a finer image quality adjustment became possible in comparison to the case of Embodiment 2. An image showing a person can be given as an example. Under the conventional system, in the image showing a person, because a fine texture existing on the skin of the person (especially the face) and hair having an inclined direction respectively show its character in different sub band from each other, after the wavelet transformation, it is difficult to have satisfactory quality of image on both simultaneously. However, in Embodiment 3, firstly, a high weight is set to the sub band corresponding to the texture exists in the flesh color tile, a high weight is set also to the sub band related to the inclined tile such as inclined hair. Weights are set to the simple tile identified as the background area and the complex tile not identified as the background area, in the likewise manner as the cases described in Embodiments 1 and 2. This way, there are advantages to satisfy the quality of image both on the texture of flesh color and the inclined hair simultaneously, and to control the linear distortions occurring at the tile borders.

Embodiment 4

Figures 11, 12:
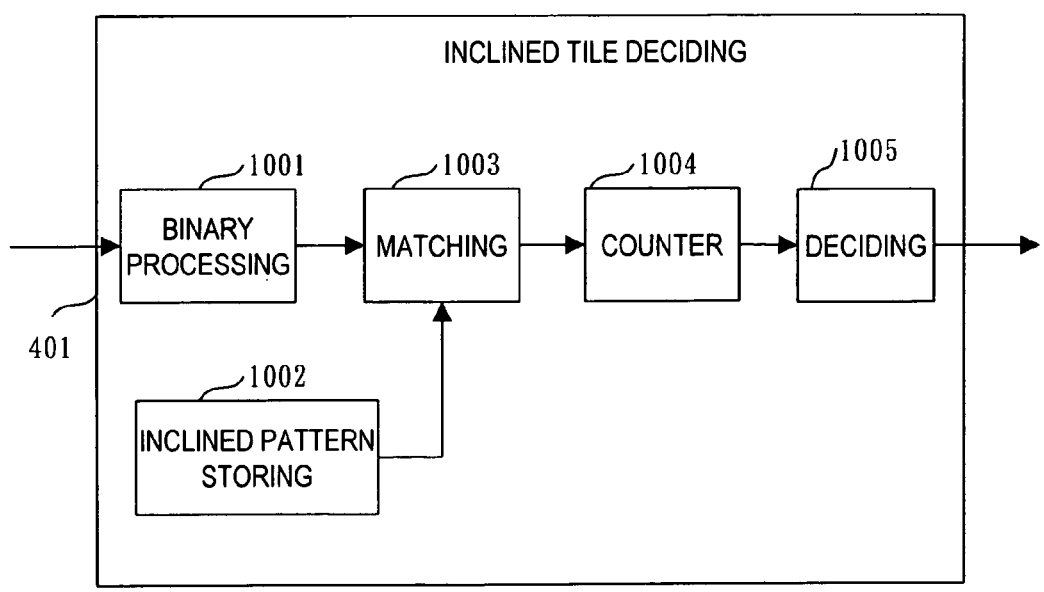
FIG. 11 shows referred pixels upon detecting an inclined direction in Embodiment 4.
FIG. 12 shows a detailed configuration of an inclined tile deciding unit 401 of Embodiment 5.

The inclined tile deciding unit 401 described in Embodiment 2 has the configuration that refers to the surrounding 24 pixels, as shown in FIG. 8. As for Embodiment 4, for example, as shown in FIG. 11, it is characterized by the configuration that refers to the surrounding 8 pixels for detecting the inclined direction. In this case, the decision processing at the deciding unit 502 of the inclined tile deciding unit 401, in the likewise manner as the case of Embodiment 2, is firstly to reset to 0 for those have negative value among 9 auto-correlation coefficients At (x, y). Then, for the coefficient At (x, y) after reset, sum 1 and sum 2 are obtained from the decider equations 7 and 8, respectively. The ratio between the sum1 and sum 2, and the threshold value Ta obtained from experiences such as experiments and simulations, are compared. For example, if the ratio between sum 1 and sum 2 is greater than the threshold value Ta, as shown below, then a particular tile is decided as the inclined tile. If the ratio between the sum1 and sum 2 is less than thethreshold value Ta, then it is decided as the non-inclined tile.

$$\text{sum1} = At(-1,-1) + At(1,1); \quad \text{(equation 7)}$$

$$\text{sum2} = At(1,-1) + At(1,-1); \quad \text{(equation 8)}$$

| If(sum1/sum2 > Ta) or (sum2/sum1 > Ta) | inclined tile |
| --- | --- |
| Else | non-inclined tile |

As can be recognized from FIG. 11, in Embodiment 4, because only a detection of inclined direction of 45 degrees is needed, although the detection precision of the inclined tile somewhat goes down, it is possible to demonstrate the effect that is almost similar to Embodiment 2. Furthermore, because an amount of calculations involved in calculating the auto-correlation coefficient (equation 4) is reduced by decreasing the referring wavelet transformation coefficient, this is effective in reducing the circuit scale, as well as in improving the speed of the decision processing.

Embodiment 5

According to Embodiment 5, the inclined tile is detected by using a different method from the inclined tile detecting method described in Embodiment 2. Hereinbelow, an inclined tile deciding unit 401 of Embodiment 5 is described with reference to FIG. 12.

FIG. 12 shows a detailed configuration of the inclined tile deciding unit 401 of Embodiment 5. Referring to FIG. 12, the reference numeral 1001 denotes a binary processing unit for binary processing the wavelet transformation coefficient being input. The reference numeral 1002 denotes an inclined pattern storing unit for storing the binary patterns of the pre-determined inclined direction. The reference numeral 1003 denotes a matching unit for collating the outputs of the binary processing unit 1001 and the inclined pattern storing unit 1002, and for identifying whether or not the focused coefficient has the inclined directivity. The reference numeral 1004 denotes a counting unit for counting a number of times the coefficient has matched the binary pattern of the inclined direction. The reference numeral 1005 denotes a deciding unit for deciding whether or not a particular tile is the inclined tile based on the final number of coefficients of the inclined pattern.

Next, the specific operation is described.

The binary processing unit 1001 processes the binary processing of each tile, by comparing, for example, the HH component Ct (x, y) having the resolution level n (the highest resolution) of the highest resolution and the threshold value Tc, as indicated below.

| If(Ct(x,y) > Tc) | Bt(x,y) = 1; |
| --- | --- |
| Else | Bt(x,y) = 0; |

In the matching unit 1003, a result of this binary processing Bt (x, y) is matched to the binary patterns of the inclined direction which are stored beforehand the inclined pattern storing unit 1002. If it matches, 1 is output. If it does not match, then 0 is output.

Figure 13:
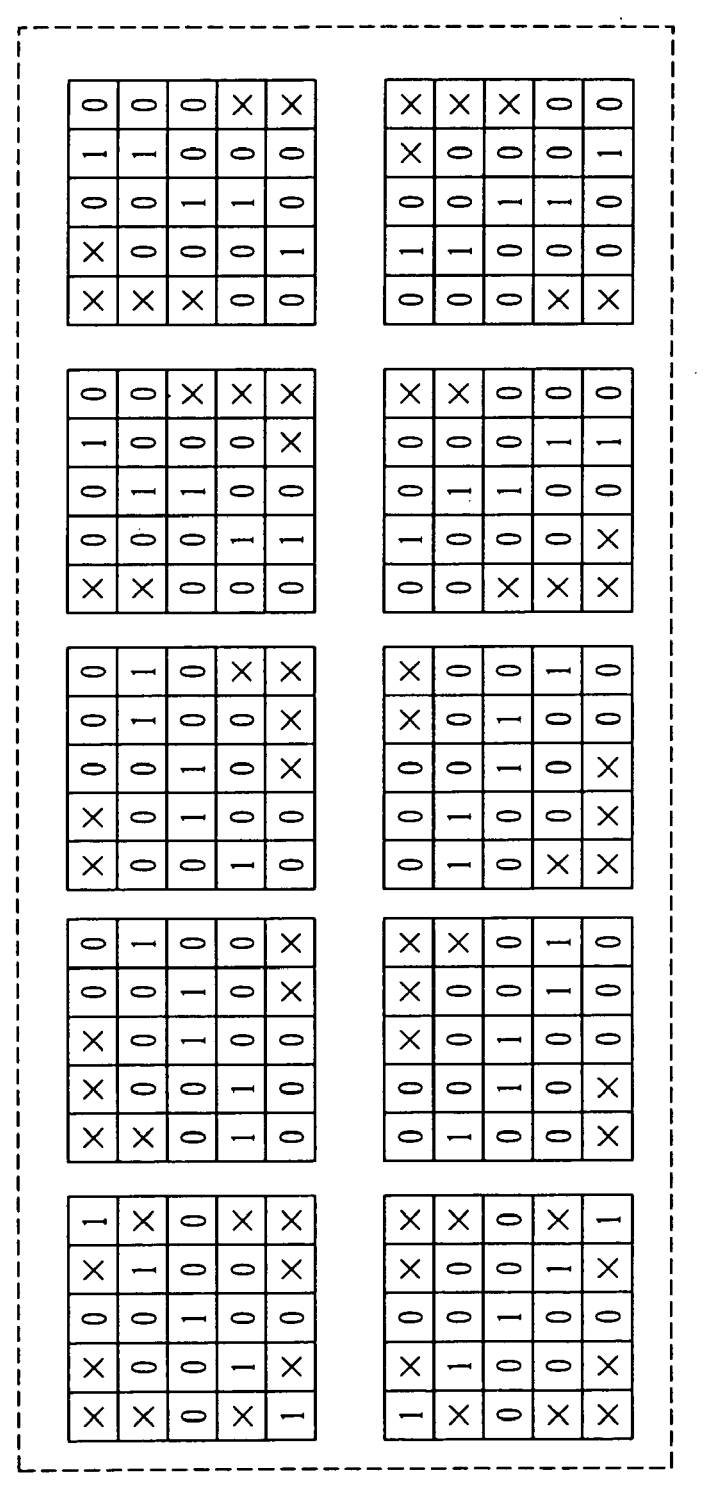

FIG. 13 shows some of the examples of the binary patterns of the inclined direction which are stored beforehand in the inclined pattern storing unit 1002. The "x" in each binary pattern of the inclined direction shown in FIG. 13 displays a binary processing results which is not referred (Don't Care).

If the output of the matching unit 1003 is 1, then the counting unit 1004 adds +1 to the count value Nt, and if it isn't 1, the counting unit 1004 does not add at all. In this way, the numbers of coefficients Nt that are matched to the inclined pattern are counted for each tile. The deciding unit 1005 decides whether or not a particular tile is the inclined tile by comparing the final count value Nt and the threshold value Tn, as shown below.

| | | |
|---|---|---|
| | If(Nt > Tn) | inclined tile |
| | Else | non-inclined tile |

Like above, according to Embodiment 5, by binary processing the HH component of the resolution level n (the highest resolution) of the highest resolution in each tile, and by matching it with the binary pattern of the inclined direction, which are registered in advance, it is possible to detect the inclined tile and demonstrate the effect that is similar to Embodiment 2.

Especially in Embodiment 2, it is necessary to carry out the multiplication 25 times in order to calculate the autocorrelation coefficient, but according to the configuration which is explained in Embodiment 5, by storing the predetermined inclined patterns, the inclined tile can be decided with just a processing of the pattern matching. In comparison to Embodiment 2, a smaller H/W scale is possible. At the same time, there is an effect that high-speed decision is possible.

Embodiment 6

Figure 14:
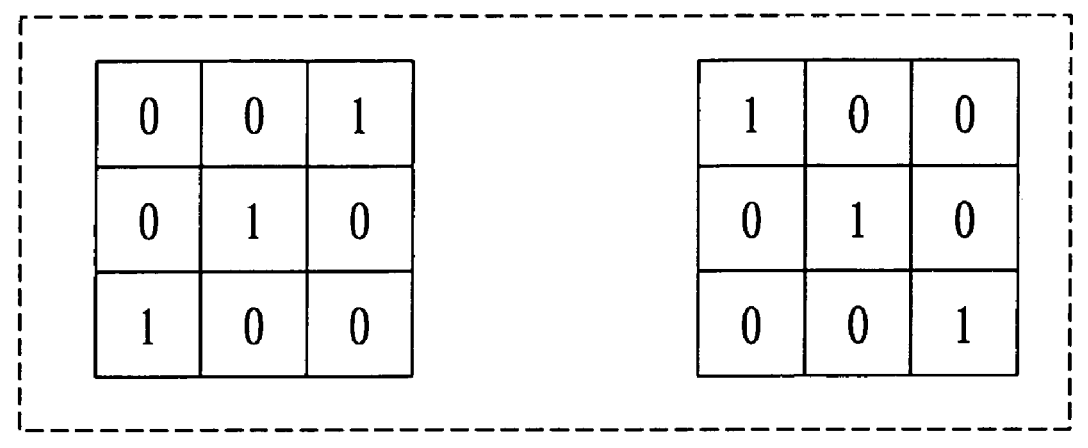

The inclined tile deciding unit 401 described in Embodiment 5, is configured to refer to the surrounding 24 pixels, as shown in FIG. 13. However, similar to Embodiment 4, Embodiment 6 is characterized to refer to the surrounding 8 pixels and detect the inclined direction, as shown in FIG. 14

In this way, similar to the case of Embodiment 4, and as can also be recognized from the same drawings, only a detection of inclined direction of 45 degrees is needed, although the detection precision of the inclined tile somewhat goes down,it is possible to demonstrate the effect that is similar to Embodiment 5. Furthermore, smaller number of pixels to be referred can reduce a capacity of a line memory which is not illustrated, a capacity for storing the inclined patterns, and the like, and there is also an effect that the decision is made in high speed.

Furthermore, according to Embodiments 1 to 6, the calculation of the degree of complexity of the complex tile deciding unit 111 has been described as the average power of the HH component, but it is not limited to this. The sub band to be referred is not limited to the HH component. All of the high frequency components of HL, LH and HH can be used. In addition to that, the degree of complexity can be calculated not with the average power, but with an absolute value of the coefficient or a variance of the coefficient, for instance. Especially, if the absolute value is used, there is no need to perform the square calculation such that the H/W scale can be small.

In addition to that, according to Embodiments 2 to 6, the inclined tile deciding units 401 have been described to carry out calculations by referring to the HH component of the resolution level of the highest resolution. However, it is not limited to this. Other sub bands like HL, LL can be referred for the inclined tile detection.

In addition to that, the inclined patterns which are shown in FIGS. 13 and 14 described in Embodiments 5 and 6 are just some of the examples. It is not limited to this. Especially, in the same drawings, the inclined line (or the inclined edge) of 1 dot line width is illustrated, but it is allowable to detect those having line width of 2 dots, for example.

In addition to that, according to Embodiments 1 to 6, as the method of controlling the image quality, it has been explained that the frequency weighting technology (the Frequency Weighting) is used, by multiplying the weight set to each sub band to the distortion. However, it is not limited to this. It is possible to carry out the image quality control which emphasizes the desired sub band by multiplying the weight set to each sub band to the wavelet transformation coefficient which is the output of the wavelet transforming unit 103. To make it this way, the distortion which is the output of the distortion memory 109 is directly input to the rate controlling unit 114 as it is, and the weight coefficient from the weight coefficient selecting unit 113 is input to the new multiplier which is installed between the wavelet transforming unit 103 and the quantizing unit 104 on the quantizing unit 104 side from the diverging point to the tile classifying unit 301. Because of this, for example, under the environment where the playback image is viewed from some distance away, since there is no need of the fine resolution, therefore, a lower weight is set to the highest resolution component of the wavelet transformation coefficient, and the amount of information can be effectively allocated to other low resolution transformation coefficients.

In addition to that, according to Embodiments 1 to 6, as the transforming unit which transforms the image signal to the frequency component, the wavelet transforming unit 103 which is standardized in JPEG2000 and the like has been described as one example, however, according to the present invention, it is not limited to the wavelet transforming unit 103. Anything will do as long as it is the transforming system that can transform the image signal to the frequency component.

In addition to that, it is needless to say that the image coding device described in Embodiments 1 to 6 can be applied as LSI, and its image coding method described in Embodiments 1 to 6 can be applied as a software, to the image processing devices such as digital camera, security camera, and image scanner, which processes the static image as the input image. This image processing device can conduct various kinds of image processing of coded data where the code amount is controlled by the image coding device, and can conduct transmitting and receiving through a communication processing unit.

INDUSTRIAL APPLICABILITY

As explained above, according to the present invention, each tile is classified into a plurality of categories according to its characteristic by referring to the transformation coefficient, the quantized distortion is weighted for each category, and the code amount of code data which is entropy coded is controlled based on the quantized distortion weighed with the weight coefficient. Therefore, in the case of coding the input image through the tile division, the coding rate of the image signal is flexibly controlled for each tile.

As a result of this, in comparison to the conventional method which sets the uniform weight over all tiles, improved flexibility in image quality setting allows a finer image adjustment in response to the characteristic of each tile, and a satisfactory playback image is obtained still even if the coding rate of the whole image is reduced. For example, in the case of controlling a linear distortion that occurs at the tile border, in order to leave a fine fluctuation texture existing in the background area, for a simple tile identified as the background area, a high weight is set to the sub band component corresponding to the fluctuation texture. On the other hand, because there's a high possibility that an amount of information more than necessary is being allotted to the complex tile which is not identified as the background area, such that a low weight is set to the high frequency component which has relatively low importance in the complex tile. This way, there is an effect of being able to control the tile border by allotting the amount of information taken from the complex tile to the sub band corresponding to the fluctuation texture of the simple tile.

The invention claimed is:

1. An image coding device for dividing an input signal into tiles of a certain size, for transforming an image signal included in each tile to a frequency component and obtaining a transformation coefficient, for quantizing an obtained transformation coefficient to a quantized coefficient, for entropy coding the quantized coefficient, for calculating a quantized distortion upon quantizing of the transformation coefficient, and for controlling a code amount of a coded data obtained by the entropy coding using the quantized distortion, comprising:
    a tile classifying unit for classifying each tile based on its characteristic into a plurality of categories by referring to the transformation coefficient, and for outputting a classified result;
    a weighting unit for weighting the quantized distortion based on an output of the tile classifying unit; and
    a rate controlling unit for controlling the code amount of a code data obtained by the entropy coding, based on the quantized distortion weighted by the weighting unit.

2. The image coding device according to claim 1, wherein the tile classifying unit decides each tile as either one of a tile including a complex texture, and a tile not including the complex texture, by referring to the transformation coefficient, and classifies each tile as either one of a category of tile including the complex texture, and a category of tile not including the complex texture.

3. The image coding device according to claim 2, wherein the tile classifying unit decides each tile is either one of a tile including the complex texture, and a tile not including the complex texture, decides whether or not each tile is a tile having a strong correlation in an inclined direction, and classifies each tile to either one of a category of tile including the complex texture, a category of tile not including the complex texture, and a category of tile having the strong correlation in the inclined direction.

4. The image coding device according to claim 2, wherein the tile classifying unit decides each tile as either one of a tile including the complex texture, a tile not including the complex texture, decides whether or not each tile is a tile having a strong correlation in the inclined direction, decides whether or not each tile is a tile including much flesh color, and classifies each tile to either one of a category of tile including the complex texture, a category of tile not including the complex texture, a category of tile having a strong correlation in the inclined direction, and a category of tile including much flesh color.

5. The image coding device according to claim 3, wherein the tile classifying unit decides whether a tile has the strong correlation in a 45 degrees inclination direction or in a 135 degrees inclination direction, when to decide the tile has the strong correlation in the inclined direction.

6. The image coding device according to claim 1, wherein the weighting unit stores beforehand weight coefficients for each sub band corresponding to each tile category, selects a desired weight coefficient based on the category and the sub band of a particular tile, and weighs the quantized distortion by multiplying a selected weight coefficient to the quantized distortion, when to weight the quantized distortion.

7. An image coding method for dividing an input signal into tiles of a certain size, for transforming an image signal included in each tile to a frequency component and obtaining a transformation coefficient, for quantizing an obtained transformation coefficient to a quantized coefficient, for entropy coding the quantized coefficient, for calculating a quantized distortion upon quantizing of the transformation coefficient, and for controlling a code amount of a coded data obtained by the entropy coding using the quantized distortion, comprising:
    classifying each tile based on its characteristic into a plurality of categories by referring to the transformation coefficient and weighting the quantized distortion with a weight coefficient for each category; and
    controlling the code amount of a code data obtained by the entropy coding, based on the quantized distortion weighted with the weight coefficient.

8. An image processing device, comprising the image coding device of claim 1, for processing the coded data where the code amount is controlled by the image coding device.

* * * * *